United States Patent [19]
Liebman et al.

[11] Patent Number: 5,647,529
[45] Date of Patent: Jul. 15, 1997

[54] METHOD OF CONTROLLING THE TEMPERATURE OF A PORTION OF AN ELECTRONIC PART DURING SOLDER REFLOW

[75] Inventors: Henry F. Liebman, Tamarac; Anthony J. Suppelsa, Coral Springs; Hal R. Canter, Fort Lauderdale, all of Fla.

[73] Assignee: Motorola, Inc., Schaumburg, Ill.

[21] Appl. No.: 402,294

[22] Filed: Mar. 10, 1995

[51] Int. Cl.$^6$ ............................................. H05K 3/34
[52] U.S. Cl. ................................... 228/222; 228/46
[58] Field of Search ............................ 228/179.1, 214, 228/216, 222, 46, 50

[56] References Cited

U.S. PATENT DOCUMENTS

| | | | |
|---|---|---|---|
| 3,430,686 | 3/1969 | Parkison et al. | 228/46 |
| 3,616,533 | 11/1971 | Heap et al. | 228/222 |
| 5,230,462 | 7/1993 | Vascak et al. | 228/222 |

FOREIGN PATENT DOCUMENTS

| | | | |
|---|---|---|---|
| 137201 | 8/1979 | Germany | 228/222 |
| 52-22945 | 6/1977 | Japan | 228/222 |

OTHER PUBLICATIONS

Electronic design, "Wet Felt Sinks Heat", p. 103, Apr. 1, 1959

Primary Examiner—Samuel M. Heinrich
Attorney, Agent, or Firm—Frank M. Scutch, III

[57] ABSTRACT

A method for controlling the temperature of a predetermined portion of an electronic part during the solder reflow process. The method includes the steps of applying (107) an absorbent material containing a fugitive material (109) to a predetermined portion of an electronic part which must be kept below the solder reflow temperature to prevent damage. Heat is then applied and the electronic part is subjected to a high reflow temperature capable of allowing solder to melt. The predetermined portion of the electronic part is controlled (113) at a substantially lower temperature than the high temperature due to evaporative cooling properties of the fugitive material avoiding damage to the electronic part.

11 Claims, 2 Drawing Sheets

METHOD OF CONTROLLING THE TEMPERATURE OF A PORTION OF AN ELECTRONIC PART DURING SOLDER REFLOW

TECHNICAL FIELD

This invention relates in general to soldering electronic parts and more particularly to reflow soldering.

BACKGROUND

Many techniques have been developed in order to produce a high volume of electronic circuits at a rapid pace. One of these processes is generally referred to as solder reflow and involves heating a printed circuit board as a unitary structure to melt or reflow solder onto a number of electronic parts at one time.

More specifically, during the reflow soldering process a solder paste is applied at predetermined positions about a printed circuit board. These positions are determined by the placement of electronic parts on the board in relation to the metal runners or traces which have been printed on the board substrate. The solder paste is applied in a thin layer and is comprised of a mixture of solder material and a flux. Most often in soldering electronic parts the flux is a rosin-like material which acts to clean any oxides from the metal traces before the solder, allowing the solder to adhere to the metal trace.

After application of the solder paste, the electronic parts are surface mounted or inserted into fabricated holes in the circuit board. The printed circuit board is then passed through a soldering oven, commonly referred to as a reflow oven, where the printed circuit board and electronic parts are subjected to a temperature profile peaking at approximately 210 degrees Celsius. The peak oven temperature is dependent on the type of alloy being reflowed. Here, each position where the solder paste has been applied is melted allowing it to bond the electronic part to the metal trace of the printed circuit board.

A problem arises during the reflow process when specific portions of the electronic device which contain heat sensitive materials are subjected to such high temperatures. Often this in itself can cause a failure either to a semiconductor device or other parts such as connectors or the like. These parts include materials which were never intended to be subjected to such high temperature but are being used in this manner to facilitate a rapid production rate using the solder reflow process.

Thus, the need exists to provide a method of controlling temperature of the electronic part during the solder reflow process to prevent damage and/or failure to electronic parts or devices, yet allow solder reflow temperatures to exist at solder joint areas.

DETAILED DESCRIPTION OF THE PREFERRED EMBODIMENT

Figure 1:
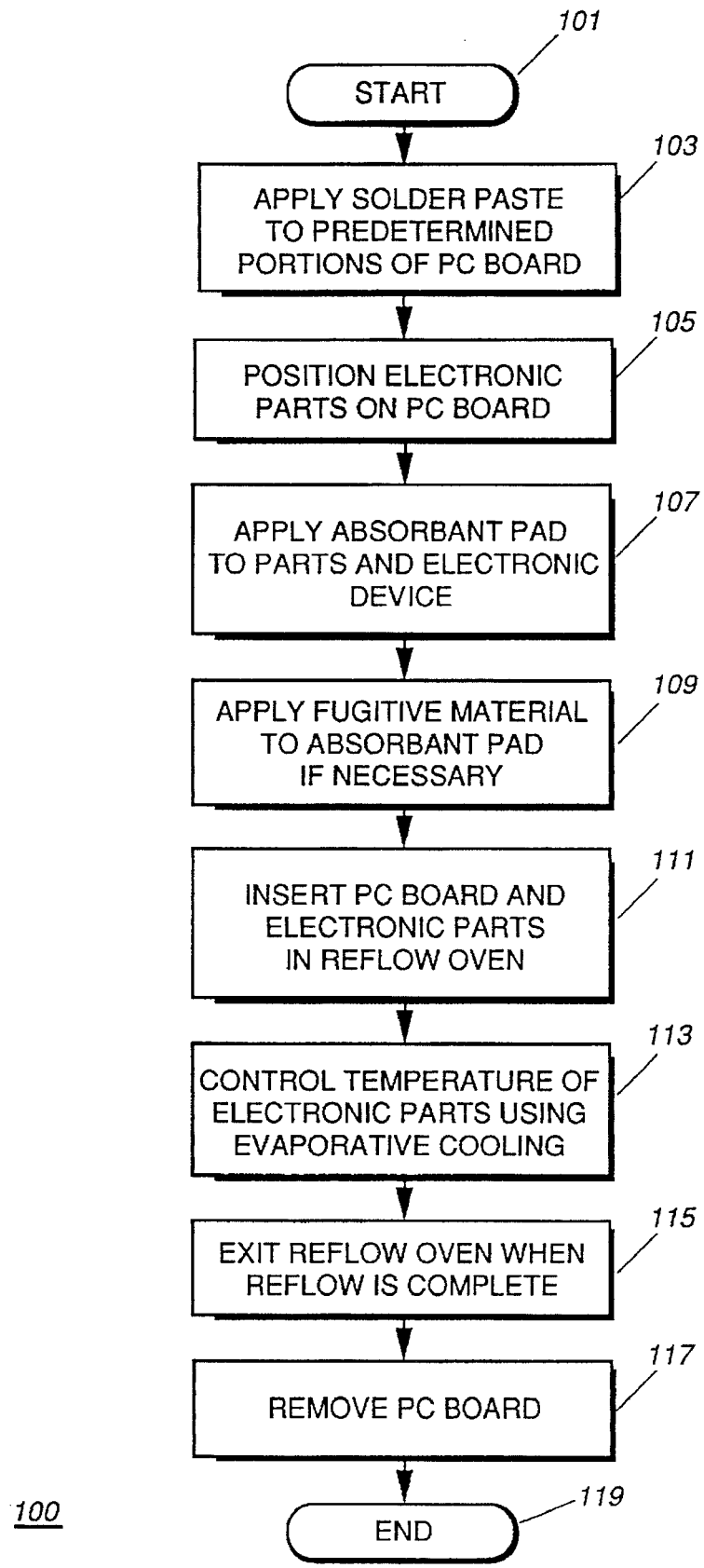
FIG. 1 is a flow chart showing the method of controlling temperature in accordance with the invention.

Referring now to FIG. 1, a flow chart 100 depicts the methods used in the invention to control a portion of an electronic part during solder reflow. At the start 101 of the process, and is well known in the art, predetermined amounts of solder paste and flux are added 103 to the circuit board at selected sites. The solder paste melts at a predetermined temperature and acts to connect the electronic part to the printed circuit board wherever the solder paste is placed. As is well known in the art, solder paste is used for providing electrical connection between an electrical part to a printed circuit board trace and/or other components. It should also be recognized that electronic parts include both discrete and surface mountable electronic components such as semiconductor attachment pins as well mechanical components such as mechanical fasteners, connectors or the like.

After the solder paste is positioned, the electronic parts are placed or attached 105 to the printed circuit board by various known methods. Once populated with their electronic parts, the circuit board is presented to a reflow oven. In order to control the temperature of an electronic part during the solder reflow process, the preferred method of the invention includes applying 107 an absorbent pad with a fugitive material absorbed into the pad to selective portions of an electronic part(s) which may be heat sensitive. Heat sensitive can be defined as those areas of the electronic part which may be damaged by overheating by high exposure temperatures generated by the reflow oven. The absorbent material may include any type of material which will not easily ignite at temperatures exceeding approximately 200 degrees C. These include any type of porous sponge-like rubbers or the like. Fugitive materials include those liquids with evaporative properties such as water or glycol that evaporate either totally or partially when subjected to a high temperature condition. These fugitive materials are highly effective for cooling purposes. Should the absorbent pad not include a fugitive material it may be added 109 at any time thereafter prior to reflow.

After the absorbent material is applied to those heat sensitive portions of the electronic device, the printed circuit board is inserted 111 into a solder reflow oven where it is subjected to substantially high temperature(s) that generally exceed 200 degrees Celsius (C.). Here, the solder paste is melted which acts to connect the electronic component to areas of the printed circuit board. In the areas in which the absorbent pad had been applied, however, those portions of the electronic device are controlled 113 at a lower temperature through use of the evaporative cooling properties and characteristics of the fugitive material.

For example, if water is used as the fugitive material, that area of the electronic component will be maintained at no higher than 100 degrees C. since this is the boiling point of water. As long as enough fugitive material remains on the selected portion of the electronic component while subjected to the high reflow temperatures, that portion of the electronic component will remain at a lower temperature than the heated internal environment of the oven. Thus, as long as the portion of the electronic component can withstand at least 100 degrees C., no damage to the selected portion containing the absorbent material will result from the high solder oven temperatures. It should be recognized by those skilled in the art that this process will be highly effective for electronic devices such as semiconductors, as well as those mechanical devices such as connectors and fastening type mechanisms that would be damaged by 200 degree C. peak reflow temperatures.

Finally, after the solder reflow process is complete, the printed circuit board is cooled 115 and the printed circuit board removed 117 which ends 119 the method of controlling the temperature during the solder reflow process.

In another embodiment, a container rather than an absorbent pad may be used to hold fugitive material. The container may be a partially insulated structure with insulated layer(s) surrounding the container except for the portion which interfaces with the electronic part. The container is made of a heat conducting metal such as copper, brass, aluminum or the like, with or without an absorbent pad. When using the container, it will be filled with the fugitive material and held or positioned in the appropriate area on or adjacent to the electronic part during the reflow process. After the process is complete, the container can be easily refilled and quickly reused any number of times. Thus, the use of a container is that of a tool to hold the fugitive material as opposed to only a sponge which typically would have limited use.

Figure 2:
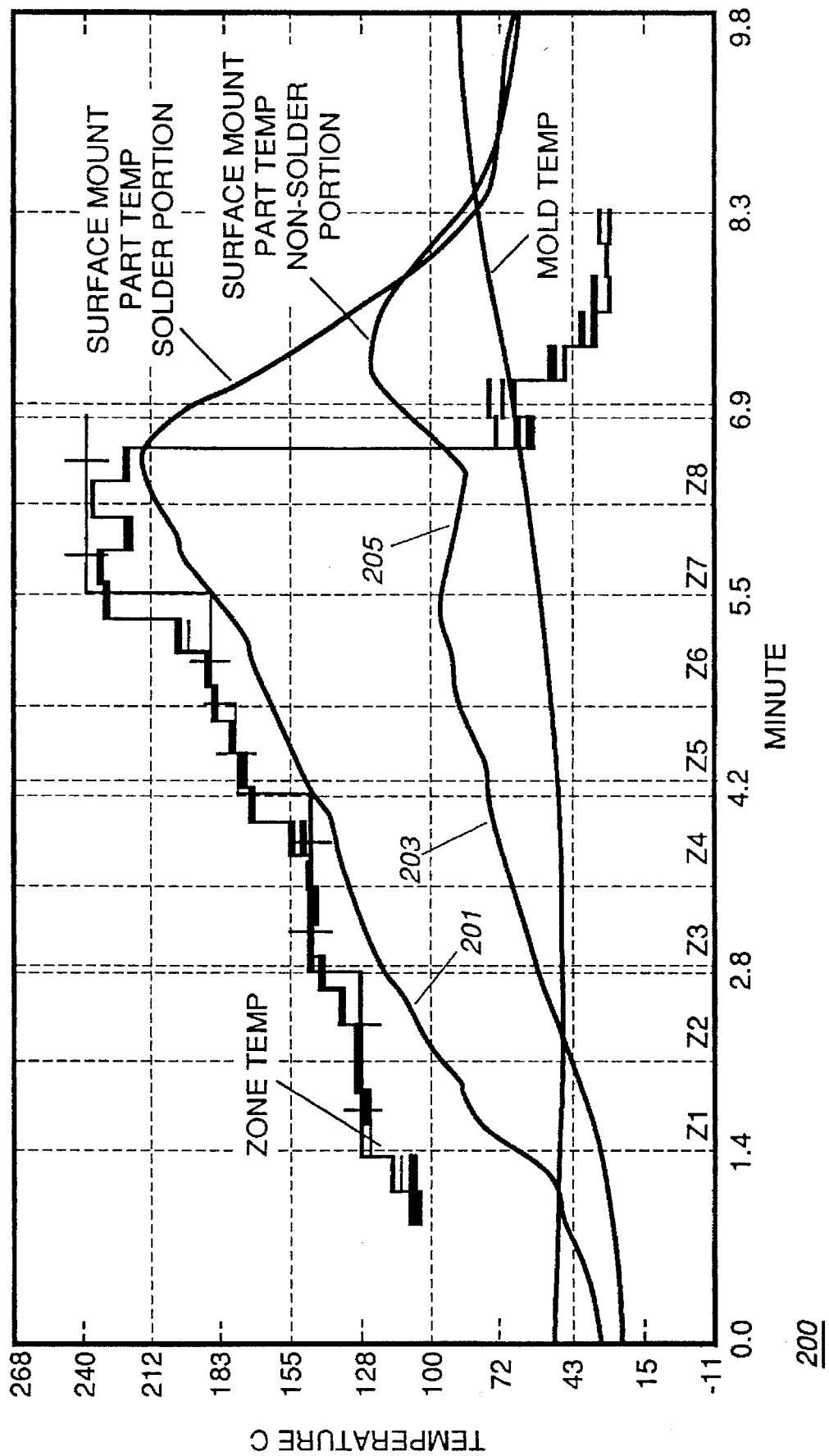
FIG. 2 is a graph showing the control of temperature of a solder portion and non-solder portion of an electronic part during the reflow process.

FIG. 2 shows a graph 200 depicting temperature in various zones versus time of an electronic component in a solder reflow oven. The line 201 represents the solder portion of an electronic part. The solder portion of the electronic component may be defined as that in which is intended to be soldered using the melted solder paste. Line 203 represents the non-solder portion of the electronic part. The non-solder portion of the electronic part is defined as that portion of the electronic part which may be temperature sensitive, and not intended to be soldered. FIG. 2 also shows the temperature measuring instruments internal temperature as well as the ambient temperature of the reflow oven divided in reflow zones 1 through 8. The reflowed part begins the process in zone 1 and moves through the reflow oven through zone 8. During and after zone 8, the part has been reflowed and begins to cool.

As can be seen in graph 200, as the temperature increases in the solder reflow oven, both the solder portion and non-solder portion rise in temperature until around 100 degree C. At this point, the temperature of the solder portion continues to increase while the non-solder portion remains substantially at a steady or lower temperature. This is illustrated at point 205. The temperature of the non-solder portion remains below a temperature which would damage that portion or area of the electronic part. This is accomplished using either the absorbent pad or container which includes the fugitive material. The fugitive material acts to cool the non-solder portion due to its evaporative properties during high reflow temperatures. Thus, the non-solder portion remains relatively cool as compared with the ambient environment of the solder reflow oven, keeping the non-solder portion undamaged until the solder reflow process is complete.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of controlling the temperature of a selective portion of an electronic part during a solder reflow process comprising the steps of:
   supplying a predetermined amount of solder material to a printed circuit board;
   positioning an electronic part onto a printed circuit board, the electronic part having a solder portion and a non-solder portion;
   applying at least one absorbent pad to only the non-solder portion of the electronic part, the at least one absorbent pad containing a fugitive material for cooling the non-solder portion during the solder reflow process; and
   subjecting the printed circuit board and electronic part to a temperature capable of melting the solder material where the solder material is melted to join the solder portion of the electronic part to the printed circuit board and further where the non-solder portion applied with the at least one absorbent pad is controlled at a temperature where it is not damaged due to a high temperature.

2. A method as in claim 1, wherein at least one absorbent pad is a porous sponge.

3. A method as in claim 1, wherein the fugitive material is water.

4. A method as in claim 1, wherein the solder portion is a semiconductor attachment pin.

5. A method as in claim 1, wherein the non-solder portion is a semiconductor housing.

6. A method as in claim 1, wherein the electronic part is a mechanical connector.

7. A method of preventing an electronic part from excessively heating during solder reflow comprising the steps of:
   applying solder to a printed circuit board in predetermined positions about an electronic part;
   selectively covering only heat sensitive portions of the electronic part with a material containing an evaporative liquid;
   subjecting the printed circuit board to an oven generating a temperature for reflowing the solder; and
   maintaining the heat sensitive portions of the electronic part below the temperature of an oven using evaporative properties of the evaporative liquid to prevent damage to the heat sensitive portions of the electronic part.

8. A method as in claim 7, where the material is a porous sponge.

9. A method as in claim 7, where the evaporative liquid is water.

10. A method as in claim 7, where the electronic part is a semiconductor device.

11. A method as in claim 7, wherein the electronic part is a mechanical connector.

* * * * *